(12) United States Patent
Jeon et al.

(10) Patent No.: US 8,765,505 B2
(45) Date of Patent: Jul. 1, 2014

(54) MULTI-LUMINOUS ELEMENT AND METHOD FOR MANUFACTURING SAME

(75) Inventors: Seong Ran Jeon, Gwangju (KR); Jae Bum Kim, Gwangju (KR); Seung Jae Lee, Jeonju-si (KR)

(73) Assignee: Korea Photonics Technology Institute, Gwangju (KR)

( * ) Notice: Subject to any disclaimer, the term of this patent is extended or adjusted under 35 U.S.C. 154(b) by 0 days.

(21) Appl. No.: 13/581,399

(22) PCT Filed: Mar. 15, 2011

(86) PCT No.: PCT/KR2011/001813
§ 371 (c)(1),
(2), (4) Date: Aug. 27, 2012

(87) PCT Pub. No.: WO2011/115414
PCT Pub. Date: Sep. 22, 2011

(65) Prior Publication Data
US 2012/0319081 A1    Dec. 20, 2012

(30) Foreign Application Priority Data

Mar. 17, 2010    (KR) .................. 10-2010-0023611

(51) Int. Cl.
*H01L 33/06*    (2010.01)
*H01L 33/32*    (2010.01)

(52) U.S. Cl.
USPC .......... 438/34; 257/13; 257/E33.023; 257/14; 257/88; 257/15; 438/35; 438/47

(58) Field of Classification Search
USPC ........... 257/13, 14, 15, 72, 79, 88, 89, 90, 96, 257/99, 103, E33.008; 438/34, 35, 47
See application file for complete search history.

(56) References Cited

U.S. PATENT DOCUMENTS

| | | | |
|---|---|---|---|
| 2002/0053681 A1* | 5/2002 | Sugawara et al. | 257/103 |
| 2002/0139984 A1* | 10/2002 | Sugawara et al. | 257/79 |
| 2003/0138983 A1* | 7/2003 | Biwa et al. | 438/46 |
| 2004/0195598 A1* | 10/2004 | Tysoe et al. | 257/233 |

(Continued)

FOREIGN PATENT DOCUMENTS

| | | |
|---|---|---|
| JP | 9-55538 | 2/1997 |
| JP | 11-233816 | 8/1999 |
| KR | 10-0699147 | 3/2007 |

OTHER PUBLICATIONS

International Search Report mailed Oct. 31, 2011 for PCT/KR2011/001813.

*Primary Examiner* — Tom Thomas
*Assistant Examiner* — John Bodnar
(74) *Attorney, Agent, or Firm* — Lowe Hauptman & Ham, LLP

(57) ABSTRACT

The present invention relates to a multi-luminous element and a method for manufacturing the same. The present invention provides the multi-luminous element comprising: a buffer layer disposed on a substrate; a first type semiconductor layer disposed on the buffer layer; a first active layer which is disposed on the first type semiconductor layer and is patterned to expose a part of the first type semiconductor layer; a second active layer disposed on the first type semiconductor layer which is exposed by the first active layer; and a second type semiconductor layer disposed on the first active layer and the second active layer, the first and second active layers being repeatedly disposed in the horizontal direction, and the method for manufacturing the same.

5 Claims, 4 Drawing Sheets

(56) References Cited

U.S. PATENT DOCUMENTS

| | | | |
|---|---|---|---|
| 2005/0161683 A1* | 7/2005 | Hahm et al. | 257/79 |
| 2005/0194598 A1* | 9/2005 | Kim et al. | 257/79 |
| 2007/0085095 A1* | 4/2007 | Ko et al. | 257/94 |
| 2007/0221932 A1* | 9/2007 | Kano et al. | 257/96 |
| 2008/0124824 A1* | 5/2008 | Tsai et al. | 438/29 |
| 2008/0308820 A1* | 12/2008 | Louwsma et al. | 257/89 |
| 2010/0051977 A1* | 3/2010 | Kim et al. | 257/93 |
| 2010/0197060 A1* | 8/2010 | Chang et al. | 438/35 |

\* cited by examiner

MULTI-LUMINOUS ELEMENT AND METHOD FOR MANUFACTURING SAME

CROSS REFERENCE TO RELATED APPLICATION

This application claims the priority of Korean Patent Application No. 10-2010-0023611, filed on Mar. 17, 2010 in the KIPO (Korean Intellectual Property Office). Further, this application is the National Phase application of International Application No. PCT/KR2011/001813 filed Mar. 15, 2011, which designates the United States and was published in Korean.

TECHNICAL FIELD

The present invention relates generally to a luminous element and a method for manufacturing the same and, more particularly, to a multi-luminous element and related manufacturing method in which the first and second active layers are repeatedly disposed in a horizontal direction to reduce loss of luminous efficiency.

BACKGROUND ART

LED (Light Emitting Diode) is a sort of semiconductor device that converts an electric current into a light, and is used as a light source for illumination or display devices. In comparison with a conventional light source, LED has relatively excellent characteristics such as an ultra-small size, low power consumption, a long life, a fast reaction time, and the like. Additionally, no use of mercury or any other discharge gas is environmentally friendly.

Meanwhile, LED is used as a white light source, which is formed of a combination of red, green and blue LEDs, a combination of a blue LED and yellow phosphor, or a combination of an UV LED and RGB phosphor.

However, use of a conventional LED for a white light source may cause a complex structure, a complicated manufacturing process, a poor luminous efficiency, or the like.

DETAILED DESCRIPTION OF THE INVENTION

Technical Problems

Accordingly, an object of the present invention is to provide a multi-luminous element having reduced loss of luminous efficiency and a method for manufacturing the same.

Another object of the present invention is to provide a multi-luminous element and manufacturing method in which the first active layer for emitting a light with the first wavelength and the second active layer for emitting a light with the second wavelength are repeatedly disposed in a horizontal direction.

Technical Solutions

In order to accomplish the above objects, one aspect of the present invention provides a multi-luminous element that comprises a buffer layer located on a substrate; a first type semiconductor layer located on the buffer layer; a first active layer located on the first type semiconductor layer and patterned to expose a part of the first type semiconductor layer; a second active layer located on the first type semiconductor layer exposed by the first active layer; and a second type semiconductor layer located on the first active layer and the second active layer, wherein the first active layer and the second active layer are repeatedly disposed side by side.

The multi-luminous element may further comprise a seed layer located between the buffer layer and the first type semiconductor layer.

The buffer layer may include AlN or GaN.

The first type semiconductor layer may include N-type GaN ohmic contact layer.

The second active layer may be divided into at least two sections which are separated by the first active layer.

The first active layer or the second active layer may have a multiple quantum wells (MQWs) structure.

The first active layer may include at least one barrier layer and at least one well layer which are stacked by turns. The barrier layer may include $Al_{x1}Ga_{1-x1-y1}In_{1-x1}N(0<x1<1, 0<y1<1, x1+y1<1)$, and the well layer may include $Al_{x2}Ga_{1-x2-y2}In_{1-x2}N(0<x2<1, 0<y2<1, x2+y2<1, x2<x1, y2<y1)$.

The second active layer may include at least one barrier layer and at least one well layer which are stacked by turns. The barrier layer may include $Al_{x3}Ga_{1-x3-y3}In_{1-x3}N(0<x3<1, 0<y3<1, x3+y3<1)$, and the well layer may include $Al_{x4}Ga_{1-x4-y4}In_{1-x4}N(0<x4<1, 0<y4<1, x4+y4<1, x4<x3, y4<y3)$.

The first active layer may include at least one barrier layer and at least one well layer which are stacked by turns, and the second active layer may include at least one barrier layer and at least one well layer which are stacked by turns. The barrier layer may have a thickness of 5 to 15 nm and the well layer may have a thickness of 1 to 3 nm.

The first active layer may be patterned to expose a part of the first type semiconductor layer in the form of a linear type pattern having a specific width, a circular type pattern having a specific diameter, or a polygonal type pattern including a rectangular type pattern having a specific breadth, in a plan view.

The multi-luminous element may further comprise a mask pattern located between the first active layer and the second type semiconductor layer.

The mask pattern may include $SiO_2$.

In the multi-luminous element, light with the third wavelength may be produced by interference between light with the first wavelength emitted from the first active layer and light with the second wavelength emitted from the second active layer.

The width, diameter or breadth of the first active layer may satisfy a specific condition $\lambda_1/4n_1$ (here, $\lambda_1$ denotes the first wavelength of light emitted from the first active layer, and $n_1$ means a refractive index of the first active layer), and the width, diameter or breadth of the second active layer may satisfy a specific condition $\lambda_2/4n_2$ (here, $\lambda_2$ denotes the second wavelength of light emitted from the second active layer, and $n_2$ means a refractive index of the second active layer).

The second type semiconductor layer may include P-type GaN ohmic contact layer.

In order to accomplish the above objects, another aspect of the present invention provides a method for manufacturing a multi-luminous element, the method comprising steps of sequentially stacking a buffer layer, a first type semiconductor layer, and a first active layer on a substrate; forming a patterned first active layer by etching the first active layer to expose a part of the first type semiconductor layer; forming a second active layer over the substrate where the patterned first active layer is formed; and forming a second type semiconductor layer on the patterned first active layer and the second active layer, wherein the second active layer is formed on the part of the first type semiconductor layer exposed by the patterned first active layer, and wherein the first active layer and the second active layer are repeatedly disposed side by side.

The step of forming the patterned first active layer may include steps of stacking a mask layer on the first active layer; forming a mask pattern by patterning the mask layer; and forming the patterned first active layer by etching the first active layer through the mask pattern so as to expose the part of the first type semiconductor layer.

The buffer layer may be formed in a temperature atmosphere of 450 to 600° C. The first type semiconductor layer or the second type semiconductor layer may be formed in a temperature atmosphere of 1000 to 1100° C. The first active layer or the second active layer may be formed in a temperature atmosphere of 700 to 850° C.

The method may further comprise step of, in the sequentially stacking step, forming a seed layer between the buffer layer and the first type semiconductor layer.

Also, the method may further comprise step of, between the step of forming the second active layer and the step of forming the second type semiconductor layer, removing the mask pattern.

Advantageous Effects

The present invention accomplishes the above discussed objects. Specifically, according to this invention, by repeatedly disposing the first and second active layers side by side, a multi-luminous element having reduced loss of luminous efficiency and capable of producing multi-wavelength is advantageously provided together with a method for manufacturing the same.

Furthermore, according to this invention, a multi-luminous element having a laterally repeated disposition in a plan view is provided together with a related manufacturing method.

BEST MODE FOR CARRYING OUT THE INVENTION

Figure 1:
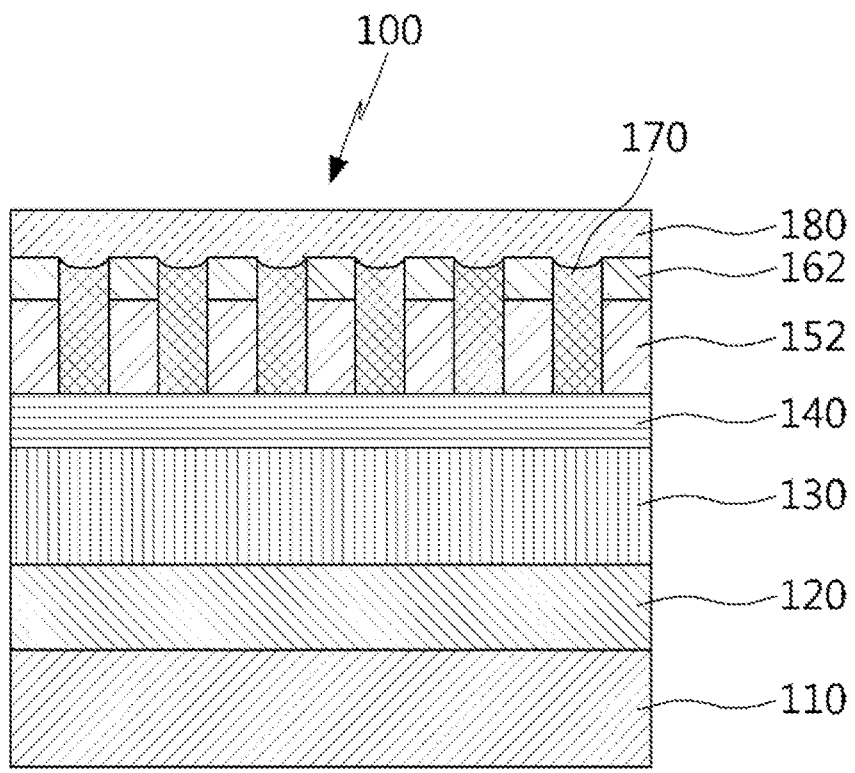
FIG. 1 is a cross-sectional view illustrating the structure of a multi-luminous element in accordance with an embodiment of the present invention.

Embodiments of the present invention will now be described more fully with reference to the accompanying drawings. This invention may, however, be embodied in many different forms and should not be construed as limited to the exemplary embodiments set forth herein. Rather, the disclosed embodiments are provided so that this disclosure will be thorough and complete, and will fully convey the scope of the invention to those skilled in the art. In the drawings, the thickness of layers and regions is exaggerated for clarity. In this disclosure, like reference numerals represent like parts.

FIG. 1 is a cross-sectional view illustrating the structure of a multi-luminous element in accordance with an embodiment of the present invention.

Referring to FIG. 1, the multi-luminous element 100 may include a substrate 110, a buffer layer 120, a seed layer 130, a first type semiconductor layer 140, a patterned first active layer 152, a mask pattern 162, a second active layer 170, and a second type semiconductor layer 180.

Alternatively, if necessary, the multi-luminous element 100 may not have the seed layer 130 or the mask pattern 162.

The substrate 110 may be $Al_2O_3$ substrate, Si substrate, SiC substrate, GaAs substrate, or sapphire substrate, and may be preferably sapphire substrate.

The buffer layer 120 may be located between the substrate 110 and the seed layer 130 or the first type semiconductor layer 140 in order to reduce a difference in lattice constant or in coefficient of thermal expansion with an upper layer. Therefore, the buffer layer 120 may be formed of any material capable of reducing a difference in lattice constant or in coefficient of thermal expansion, preferably including AlN or GaN.

The seed layer 130 may be located on the buffer layer 120. The seed layer 130 may be μ-GaN layer, which may be formed of undoped GaN.

The first type semiconductor layer 140 may be located on the buffer layer 120 or on the seed layer 130. The first type semiconductor layer 140 may be a semiconductor layer including nitride, for example, including GaN, $Al_xGa_{1-x}N$ ($0<x<1$), $In_xGa_{1-x}N (0<x<1)$, or $In_xAl_yGa_{1-(x+y)}N(0<x<1, 0<y<1, x+y<1)$, preferably including GaN. Here, GaN may be N-type GaN doped with N-type impurities, especially N-type GaN ohmic contact layer doped with Si.

The patterned first active layer 152 may have a quantum well structure, preferably a multiple quantum wells (MQWs) structure. Namely, the patterned first active layer 152 includes at least one barrier layer (not shown) and at least one well layer (not shown), which may be stacked by turns. The patterned first active layer 152 is formed to expose a part of the first type semiconductor layer 140. The barrier layer of the patterned first active layer 152 may include $Al_{x1}Ga_{1-x1-y1}In_{1-x1}N(0<x1<1, 0<y1<1, x1+y1<1)$, and the well layer of the patterned first active layer 152 may include $Al_{x2}Ga_{1-x2-y2}In_{1-x2}N(0<x2<1, 0<y2<1, x2+y2<1, x2<x1, y2<y1)$. The barrier layer of the patterned first active layer 152 may be formed with a thickness of 5 to 15 nm, and the well layer of the patterned first active layer 152 may be formed with a thickness of 1 to 3 nm.

Figure 5:
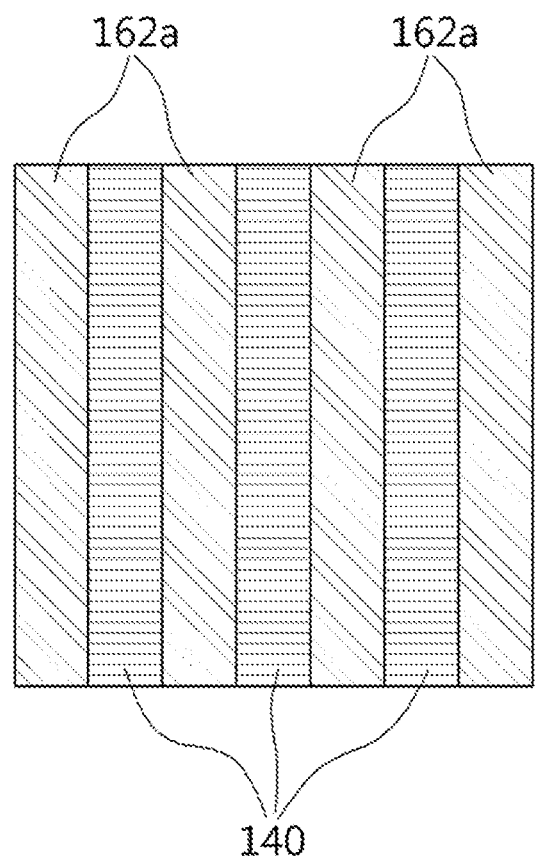
FIGS. 5 to 7 are plan views illustrating forms of the patterned first active layer.
Figure 6:
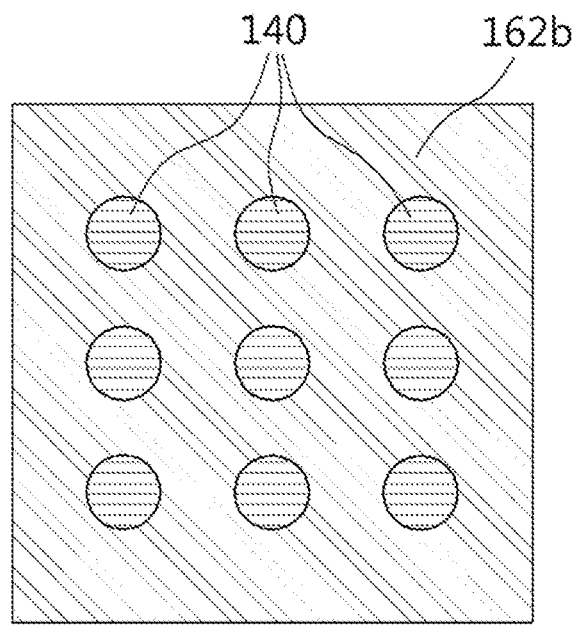
Figure 7:
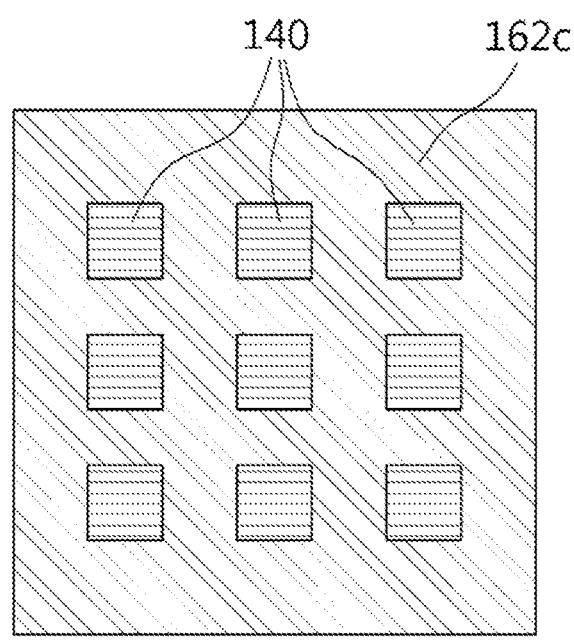

The mask pattern 162 may be located on the patterned first active layer 152. The mask pattern 162 may be formed of any material capable of producing a pattern, preferably formed of $SiO_2$, with a thickness of 50 to 200 nm, preferably with a thickness of 100 nm. The mask pattern 162 is used as a mask for forming the patterned first active layer 152, so that the shape of the patterned first active layer 152 may be determined depending on the mask pattern 162. As shown in FIGS. 5 to 7 to be discussed later, the mask pattern 162 may be formed with one of a linear type pattern 162a having a specific width in a plan view, a circular type pattern 162b having a specific diameter in a plan view, and a polygonal type pattern such as a rectangular type pattern 162c having a specific breadth in a plan view. Therefore, the first active layer 152 may be patterned to expose a part of the underlying first type semiconductor layer 140 in the form of a linear type having a specific width, a circular type having a specific diameter, or a polygonal type such as a rectangular type having a specific breadth, in a plan view.

The patterned first active layer 152 may be formed with patterns having a width, diameter or breadth between 10 nm and 10 μm, which may be determined depending on the first wavelength of light emitted from the first active layer 152. This width, diameter or breadth of the patterned first active layer 152 may be determined to satisfy a specific condition $\lambda_1/4n_1$. Here, $\lambda_1$ denotes the first wavelength of light emitted from the patterned first active layer 152, and $n_1$ means a refractive index of the patterned first active layer 152. For example, if the first wavelength of light emitted from the patterned first active layer 152 is 500 nm, and if a refractive index of the patterned first active layer 152 is 2.5, the width, diameter or breadth of the patterned first active layer 152 may be 500 nm/(4×2.5), i.e., 50 nm.

The second active layer 170 may be located on the first type semiconductor layer 140, more exactly, on a part of the first type semiconductor layer 140 exposed by the patterned first active layer 152. Namely, the second active layer 170 and the patterned first active layer 152 may be located side by side and repeatedly disposed in a horizontal direction. The second active layer 170 may be divided into at least two sections by the patterned first active layer 152, and adjacent two sections of the second active layer 170 may be separated by the patterned first active layer 152. That is to say, the patterned first active layer 152 may also be divided into at least two sections by the second active layer 170, and adjacent two sections of the patterned first active layer 152 may be separated by the second active layer 170.

The second active layer 170 may have a quantum well structure, preferably a multiple quantum wells (MQWs) structure. Namely, the second active layer 170 includes at least one barrier layer (not shown) and at least one well layer (not shown), which may be stacked by turns. The barrier layer of the second active layer 170 may include $Al_{x3}Ga_{1-x3-y3}In_{1-x3}N(0<x3<1, 0<y3<1, x3+y3<1)$, and the well layer of the second active layer 170 may include $Al_{x4}Ga_{1-x4-y4}In_{1-x4}N$ ($0<x4<1$, $0<y4<1$, $x4+y4<1$, $x4<x3$, $y4<y3$). The barrier layer of the second active layer 170 may be formed with a thickness of 5 to 15 nm, and the well layer of the second active layer 170 may be formed with a thickness of 1 to 3 nm.

The second active layer 170 may be formed with patterns having a width, diameter or breadth between 10 nm and 10 μm, which may be determined depending on the second wavelength of light emitted from the second active layer 170. This width, diameter or breadth of the second active layer 170 may be determined to satisfy a specific condition $\lambda_2/4n_2$. Here, $\lambda_2$ denotes the second wavelength of light emitted from the second active layer 170, and $n_2$ means a refractive index of the second active layer 170. For example, if the second wavelength of light emitted from the second active layer 170 is 300 nm, and if a refractive index of the second active layer 170 is 2.5, the width, diameter or breadth of the second active layer 170 may be 300 nm/(4×2.5), i.e., 30 nm.

The second active layer 170 may emit light having the second wavelength which is different from the wavelength of light emitted from the patterned first active layer 152. Although having the same constituents, the first and second active layers 152 and 170 may emit light with the first wavelength and light with the second wavelength, respectively, by varying the ratio of Al to In or Ga. Here, according as the ratio of Al increases in comparison with the ratio of In or Ga, the wavelength of light emitted is decreased. Therefore, in order for the patterned first active layer 152 to emit light having a longer wavelength in comparison with the second active layer 170, the patterned first active layer 152 may be formed to have a lower ratio of In or Ga to Al in comparison with the second active layer 170.

The second type semiconductor layer 180 may be a semiconductor layer including nitride, for example, including GaN, $Al_xGa_{1-x}N(0<x<1)$, $In_xGa_{1-x}N(0<x<1)$, or $In_xAl_yGa_{1-(x+y)}N(0<x<1, 0<y<1, x+y<1)$, preferably including GaN. Here, GaN may be P-type GaN ohmic contact layer doped with P-type impurities. The second type semiconductor layer 180 may be located on the patterned first active layer 152 and the second active layer 170. While the second type semiconductor layer 180 may be in a direct contact with the second active layer 170, the mask pattern 162 may be interposed between the second type semiconductor layer 180 and the patterned first active layer 152. If the mask pattern 162 is not included, the second type semiconductor layer 180 may be in a direct contact with both of the patterned first active layer 152 and the second active layer 170.

An electrical connection, i.e., a flow of current, among the first type semiconductor layer 140, the patterned first active layer 152, the second active layer 170, and the second type semiconductor layer 180 may vary depending on whether the mask pattern 162 is included or not. If the mask pattern 162 is not existent, there are three paths, namely, a path connected by the first type semiconductor layer 140, the patterned first active layer 152, and the second type semiconductor layer 180, a path connected by the first type semiconductor layer 140, the second active layer 170, and the second type semiconductor layer 180, and a path connected by the first type semiconductor layer 140, the patterned first active layer 152, the second active layer 170, and the second type semiconductor layer 180. In contrast, if the mask pattern 162 is existent, the mask pattern 162 acts as an insulating layer and thus there are two paths, namely, a path connected by the first type semiconductor layer 140, the second active layer 170, and the second type semiconductor layer 180, and a path connected by the first type semiconductor layer 140, the patterned first active layer 152, the second active layer 170, and the second type semiconductor layer 180.

Therefore, since the first and second active layers 152 and 170 which respectively emit lights with different wavelengths are repeatedly disposed side by side, the multi-luminous element 100 of an embodiment has the advantage of capability to produce multi-wavelength without loss of luminous efficiency. In this multi-luminous element 100, each of the patterned first active layer 152 and the second active layer 170 may be formed with a quantum well structure.

Among the light emitted from the patterned first active layer 152, light emitted in a vertical direction from the patterned first active layer 152 advances in an upward or downward direction of the multi-luminous element 100. However, light emitted in a horizontal direction, namely emitted laterally, from the patterned first active layer 152 advances in other form. Specifically, light emitted laterally from the patterned first active layer 152 meets a surface of the second active layer 170 on a transmission path of light. The patterned first active layer 152 and the second active layer 170 have different refractive indexes due to different ratios of constituents. Therefore, light emitted from the patterned first active layer 152 is refracted or reflected at the surface of the second active layer 170. Since the width, diameter or breadth of the patterned first active layer 152 satisfies a specific condition $\lambda_1/4n_1$ as discussed above, laterally transmitted light from the patterned first active layer 152 is amplified. As a result, the light extraction efficiency of the patterned first active layer 152 is enhanced.

The same applies to the second active layer 170. Specifically, light emitted in a vertical direction from the second active layer 170 advances in an upward or downward direction of the multi-luminous element 100, and light emitted from the second active layer 170 is refracted or reflected at the surface of the patterned first active layer 152. Since the width, diameter or breadth of the second active layer 170 satisfies a specific condition $\lambda_2/4n_2$ as discussed above, laterally transmitted light from the second active layer 170 is amplified. As a result, the light extraction efficiency of the second active layer 170 is enhanced.

Meanwhile, there may occur interference between light emitted from the patterned first active layer 152 and light emitted from the second active layer 170. Therefore, light with third wavelength caused by a combination of the first wavelength of light emitted from the patterned first active layer 152 and the second wavelength of light emitted from the second active layer 170 may be extracted.

Additionally, the multi-luminous element 100 of an embodiment may extract light with various colors. Namely, depending on the first wavelength of light emitted from the patterned first active layer 152 and the second wavelength of light emitted from the second active layer 170, the multi-luminous element 100 may extract light having various colors such as red, green or blue and also extract white light or other light such as ultraviolet light or infrared light. This extraction of light having various wavelengths may cause the possibility of being applied to various fields.

For example, if the multi-luminous element 100 is used as a light source for the growth of plants, light having a wavelength corresponding to blue (Blue light is believed to promote the formation of leaves of plants.) may be extracted from the patterned first active layer 152, and light having a wavelength corresponding to red (Red light is believed to promote photosynthesis.) or light having a wavelength corresponding to ultraviolet (UV light is believed to make the leaves of plants thick or to promote the color formation of pigment.) may be extracted from the second active layer 170. In this case, the patterned first active layer 152 may have the well layer composed of 2% Al, 76% Ga, and 22% In so as to extract light with 460 nm wavelength corresponding to blue. The second active layer 170 may have the well layer composed of 0.5% Al, 49.5% Ga, and 50% In so as to extract red light with 650 nm wavelength or have the well layer composed of 6% Al, 86% Ga, and 8% In so as to extract UV light with 380 nm wavelength.

Additionally, in order to use the multi-luminous element 100 as a white light source, the patterned first active layer 152 may extract yellow light and the second active layer 170 may extract blue light. In this case, the patterned first active layer 152 may have 0.8% Al, 59.2% Ga, and 40% In so as to extract yellow light, and the second active layer 170 may have 2% Al, 76% Ga, and 22% In so as to extract blue light.

Although in the above-discussed embodiment the multi-luminous element 100 includes two active layers only, it is possible to have three or more active layers which emit light with different wavelengths.

Figure 2:
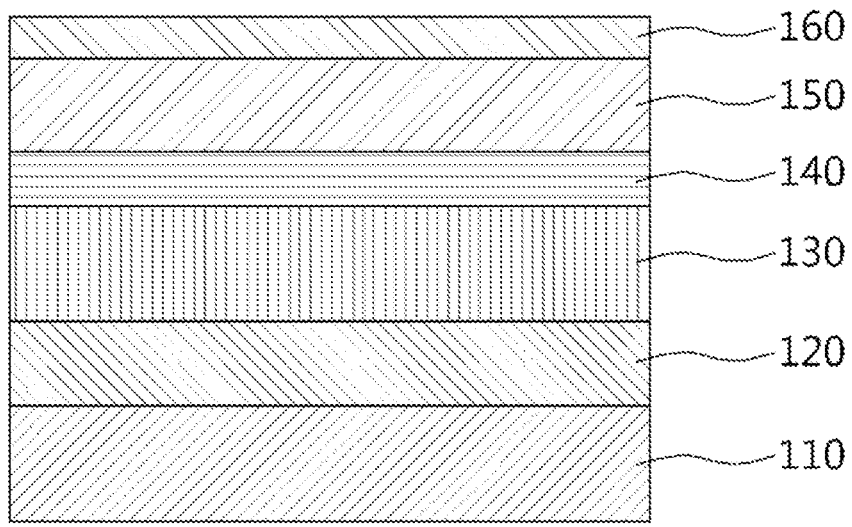
FIGS. 2 to 4 are cross-sectional views illustrating a process of manufacturing a multi-luminous element in accordance with an embodiment of the present invention.
Figure 3:
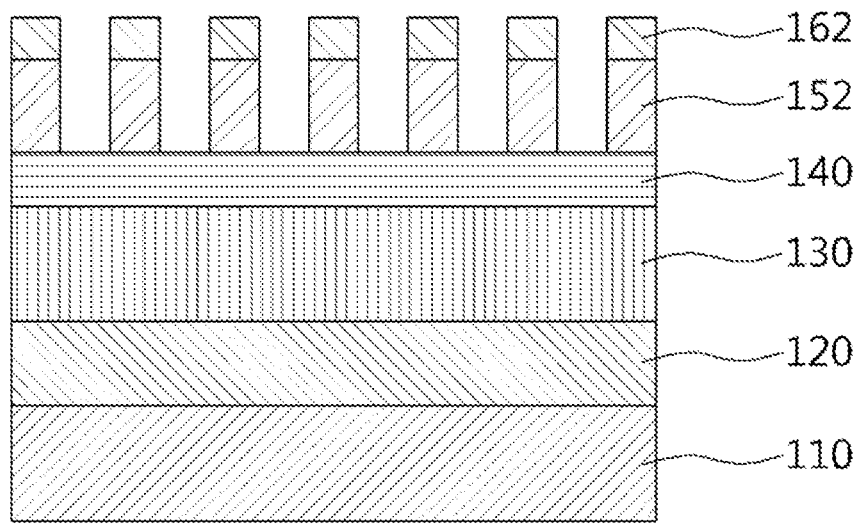
Figure 4:
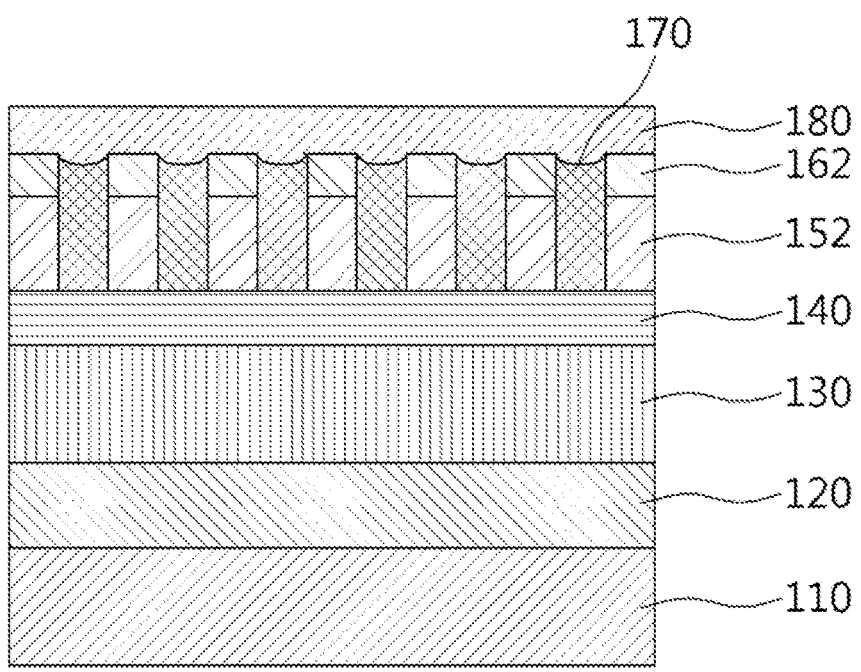

FIGS. 2 to 4 are cross-sectional views illustrating a process of manufacturing a multi-luminous element in accordance with an embodiment of the present invention.

FIGS. 5 to 7 are plan views illustrating forms of the patterned first active layer.

Referring to FIGS. 2 to 7, a method for manufacturing a multi-luminous element according to an embodiment begins with preparing the substrate 110.

The substrate 110 may be $Al_2O_3$ substrate, Si substrate, SiC substrate, GaAs substrate, or sapphire substrate, and may be preferably sapphire substrate ($Al_2O_3$ substrate).

Next, the buffer layer 120, the seed layer 130, the first type semiconductor layer 140, a first active layer 150, and a mask layer 160 are sequentially stacked on the substrate 110.

Each of the buffer layer 120, the seed layer 130, the first type semiconductor layer 140, the first active layer 150, and the mask layer 160 may be formed using physical vapor deposition or chemical vapor deposition such as sputtering, PECVD (Plasma Enhanced Chemical Vapor Deposition), MOCVD (Metal Organic Chemical Vapor Deposition), ALD (Atomic Layer Deposition), MBE (Molecular Beam Epitaxy), and HVPE (Hybrid Vapor Phase Epitaxy).

The buffer layer 120 may be formed of nitride including AlN or GaN, and the seed layer 130 may be formed of undoped μ-GaN.

The first type semiconductor layer 140 may be a semiconductor layer including nitride, for example, including GaN, $Al_xGa_{1-x}N(0<x<1)$, $In_xGa_{1-x}N(0<x<1)$, or $In_xAl_yGa_{1-(x+y)}N$ $(0<x<1, 0<y<1, x+y<1)$, preferably including GaN. Here, GaN may be N-type GaN doped with N-type impurities, especially N-type GaN ohmic contact layer doped with Si. The first active layer 150 is formed by stacking at least one barrier layer with 5 to 15 nm thickness and at least one well layer with 1 to 3 nm thickness. The barrier layer may be composed of $Al_{x1}Ga_{1-x1-y1}In_{1-x1}N(0<x1<1, 0<y1<1, x1+y1<1)$, and the well layer may be composed of $Al_{x2}Ga_{1-x2-y2}In_{1-x2}N(0<x2<1, 0<y2<1, x2+y2<1, x2<x1, y2<y1)$.

The mask layer 160 may be formed of any material capable of producing a pattern, preferably formed of $SiO_2$, with a thickness of 50 to 200 nm, preferably 100 nm thickness.

It is desirable that the buffer layer 120 is formed in a temperature atmosphere of 450 to 600° C., the first type semiconductor layer 140 is formed in a temperature atmosphere of 1000 to 1100° C., and the first active layer 150 is formed in a temperature atmosphere of 700 to 850° C.

Next, using a patterning process, the mask pattern 162 is formed from the mask layer 160. As shown in FIGS. 5 to 7, the mask pattern 162 may be formed to have at least one of a linear type pattern 162a having a specific width in a plan view, a circular type pattern 162b having a specific diameter in a plan view, and a polygonal type pattern such as a rectangular type pattern 162c having a specific breadth in a plan view in order to expose a part of the underlying first type semiconductor layer 140. The mask pattern 162 is formed to have a width, diameter or breadth between 10 nm and 10 μm.

Next, by etching the first active layer 150 through the mask pattern 162, the patterned first active layer 152 is formed. Namely, the first active layer 150 is etched to expose a part of the first type semiconductor layer 140, thus forming the patterned first active layer 152. Preferably, a dry etching which is an anisotropic etching is used.

Next, the second active layer 170 is formed over the substrate 110 having the patterned first active layer 150. The second active layer 170 is formed by stacking at least one barrier layer with 5 to 15 nm thickness and at least one well layer with 1 to 3 nm thickness. The barrier layer may be composed of $Al_{x3}Ga_{1-x3-y3}In_{1-x3}N(0<x3<1, 0<y3<1, x3+y3<1)$, and the well layer may be composed of $Al_{x4}Ga_{1-x4-y4}In_{1-x4}N(0<x4<1, 0<y4<1, x4+y4<1, x4<x3, y4<y3)$.

Like the first active layer 150, the second active layer 170 may be formed in a temperature atmosphere of 700 to 850° C. For example, the second active layer 170 may be formed through growth using epitaxial growth technique or the like on a part of the first type semiconductor layer 140 exposed by the patterned first active layer 152. At this time, the second active layer 170 is not formed on the mask pattern 162 since the growth of the second active layer 170 is not permitted on the mask pattern 162.

Alternatively, the second active layer 170 may be formed through vapor deposition technique using organic metal such as MOCVD over the substrate 110 having the patterned first active layer 152. In this case, the second active layer 170 may be formed on the mask pattern 162 as well as on the first type semiconductor layer 140 exposed by the patterned first active layer 152. Therefore, the second active layer 170 formed on the mask pattern 162 is removed through wet etching using BOE (Buffer Oxide Etchant) and HF solution or through equipment for planarization such as CMP (Chemical Mechanical Planarization).

After the second active layer 170 is formed, if necessary, the mask pattern 162 may be removed.

As discussed above, the patterned first active layer 152 and the second active layer 170 are formed using the mask pattern 162. However, if necessary, three or more active layers may be formed using two or more mask patterns.

Next, the second type semiconductor layer 180 is formed over the substrate 110 having the patterned first active layer 152 and the second active layer 170. As a result, the multi-luminous element according to an embodiment is obtained.

The second type semiconductor layer 180 may be formed in a temperature atmosphere of 1000 to 1100° C. The second type semiconductor layer 180 may be a semiconductor layer including nitride, for example, including GaN, $Al_xGa_{1-x}N$ ($0<x<1$), $In_xGa_{1-x}N$ ($0<x<1$), or $In_xAl_yGa_{1-(x+y)}N$ ($0<x<1$, $0<y<1$, $x+y<1$), preferably including GaN. Here, GaN may be P-type GaN ohmic contact layer doped with P-type impurities.

While this invention has been particularly shown and described with reference to an exemplary embodiment thereof, it will be understood by those skilled in the art that various changes in form and details may be made therein without departing from the spirit and scope of the invention as defined by the appended claims.

What is claimed is:

1. A method for manufacturing a multi-luminous element, the method comprising steps of:
   sequentially stacking a buffer layer, a first type semiconductor layer, and a first active layer on a substrate;
   forming a patterned first active layer by etching the first active layer to expose a part of the first type semiconductor layer;
   forming a second active layer over the substrate where the patterned first active layer is formed; and
   forming a second type semiconductor layer on the patterned first active layer and the second active layer,
   wherein the second active layer is formed on the part of the first type semiconductor layer exposed by the patterned first active layer, and wherein the first active layer and the second active layer are repeatedly disposed side by side.

2. The method of claim 1, wherein the step of forming the patterned first active layer includes steps of:
   stacking a mask layer on the first active layer;
   forming a mask pattern by patterning the mask layer; and
   forming the patterned first active layer by etching the first active layer through the mask pattern so as to expose the part of the first type semiconductor layer.

3. The method of claim 2, wherein the buffer layer is formed in a temperature atmosphere of 450 to 600° C., wherein the first type semiconductor layer or the second type semiconductor layer is formed in a temperature atmosphere of 1000 to 1100° C., and wherein the first active layer or the second active layer is formed in a temperature atmosphere of 700 to 850° C.

4. The method of claim 2, further comprising step of:
   in the sequentially stacking step, forming a seed layer between the buffer layer and the first type semiconductor layer.

5. The method of claim 2, further comprising step of:
   between the step of forming the second active layer and the step of forming the second type semiconductor layer, removing the mask pattern.

\* \* \* \* \*